(12) United States Patent
Davis et al.

(10) Patent No.: US 6,737,875 B2
(45) Date of Patent: May 18, 2004

(54) METHOD AND APPARATUS FOR IN-CIRCUIT IMPEDANCE MEASUREMENT

(75) Inventors: Larry J. Davis, Highland, UT (US); Kenneth M. Cox, Orem, UT (US)

(73) Assignee: Damerco, Inc., Springville, UT (US)

( * ) Notice: Subject to any disclaimer, the term of this patent is extended or adjusted under 35 U.S.C. 154(b) by 62 days.

(21) Appl. No.: 10/024,587

(22) Filed: Dec. 17, 2001

(65) Prior Publication Data

US 2002/0153901 A1 Oct. 24, 2002

Related U.S. Application Data

(63) Continuation-in-part of application No. 09/576,313, filed on May 22, 2000, now abandoned.

(51) Int. Cl.⁷ .................... G01R 29/26; G01R 31/12; G01R 31/02; G01R 27/08
(52) U.S. Cl. .................... 324/713; 324/548; 324/549; 324/704; 324/715
(58) Field of Search .................... 324/713, 548, 324/549, 704, 715, 72.5, 545

(56) References Cited

U.S. PATENT DOCUMENTS

| | | | |
|---|---|---|---|
| 3,931,506 A | 1/1976 | Borrelli et al. | 714/724 |
| 4,050,017 A | 9/1977 | Paufve | 324/72.5 |
| 4,458,196 A | 7/1984 | Goyal et al. | 324/649 |
| 4,540,002 A * | 9/1985 | Atlas | 600/547 |
| 4,651,086 A | 3/1987 | Domenichini et al. | 324/715 |
| 4,856,001 A | 8/1989 | McElfresh et al. | 714/734 |
| 4,870,341 A * | 9/1989 | Pihl et al. | 324/600 |
| 5,127,009 A | 6/1992 | Swanson | 714/734 |
| 5,140,276 A | 8/1992 | Fisher | 324/713 |
| 5,307,019 A | 4/1994 | Robey et al. | 324/713 |
| 5,457,402 A | 10/1995 | Sato | 324/772 |
| 5,550,477 A | 8/1996 | Domenichini et al. | 324/545 |
| 5,627,476 A | 5/1997 | Chambers | 324/704 |
| 5,696,772 A | 12/1997 | Lesmeister | 714/32 |
| 5,748,642 A | 5/1998 | Lesmeister | 714/724 |
| 5,781,021 A | 7/1998 | Ilani | 324/754 |
| 5,804,979 A | 9/1998 | Lund et al. | 324/713 |
| 5,818,251 A | 10/1998 | Intrater | 324/765 |
| 6,016,058 A | 1/2000 | Sussman et al. | 324/543 |

* cited by examiner

*Primary Examiner*—Christine Oda
*Assistant Examiner*—Wasseem H. Hamdan
(74) *Attorney, Agent, or Firm*—Thorpe North & Western LLP

(57) ABSTRACT

A device and method for measuring an impedance between first and second nodes in an electrical circuit without removing components includes at least one current source to provide first and second currents or current signals of known values. First and second probes contact the respective first and second nodes to apply the first and second currents. A third common probe contacts the circuit at a common node that experiences the same current flow as between the first and second nodes. At least one voltage meter measures voltages corresponding to the first and second currents. A processor calculates the impedance based on the known values of the currents, and the measured values of the voltages.

57 Claims, 5 Drawing Sheets

METHOD AND APPARATUS FOR IN-CIRCUIT IMPEDANCE MEASUREMENT

This application is a continuation-in-part application U.S. patent application Ser. No. 09/576,313, filed May 22, 2000, was abandoned on Oct. 28, 2002.

BACKGROUND OF THE INVENTION

1. Field of the Invention

The present invention relates generally to in-circuit impedance measurement. More particularly, the present invention relates to a method and apparatus for measuring an unknown impedance without removing the components from a circuit.

2. Related Art

It is often desirable to test a discrete component which is part of a larger circuit. The measurement of a component's impedance is useful in determining whether or not a component is functioning properly, and may be used in determining other operating characteristics of the component. In addition, such measurement may be utilized to verify whether or not a correct component was loaded on a printed circuit board.

The testing of circuits and components may be classified generally into two categories, namely analog and digital. Analog testing refers to the measurement of quantitative and continuous signals. For example, the measurement of voltage, current, and frequency are typically classified as analog measurements. Analog testing is sometimes referred to as dynamic testing when time or another dynamic variable parameter is involved. In addition, analog testing is sometimes referred to as static testing when a fixed, non-dynamic variable parameter is involved.

The process of functional testing includes applying a signal similar to the signal which would normally be experienced in the intended application to the input terminals of a device under test. The output signal is then determined to be acceptable or not for normal operation. In digital functional testing, a digital output is examined to determine if it matches the expected pattern of 1s and 0s. In analog functional testing, the output signals are measured to determine if their incremental levels fall within the acceptable limits of time, voltage, current or other parameters.

Separate components may be easily tested or measured by themselves. For example, measurement of impedance may be accomplished by connecting the component directly to a meter. A known current may be applied through the component and the voltage across the component measured. The impedance is the ratio of voltage to current.

Special problems arise when testing a component in-circuit, because of the interaction of the component with the remainder of the circuit to which it is connected. For example, a current applied between two nodes or across a component flows only partially through the component, because the current will be shared with all the elements in the circuit. Thus, the impedance for the individual element cannot be directly determined by the voltage across the element because the current through the element is unknown.

Various devices and methods have been developed in an attempt to test or measure components in-circuit. Such devices and methods tend to be complicated, cumbersome, and expensive. Such testing may be accomplished as a verification of design. For example, a voltage or current may be applied at two or more nodes, and the voltages of all other nodes are measured and compared to a design simulation. If the nodes are within a tolerance window the components of the circuit are presumed valid.

Presently, there is no known effective method or device for providing the accurate measure of a single unknown component while in a circuit. If the component's value is to be determined accurately, it is removed from the circuit and tested as a separate element using a classical impedance measuring instrument, such as a resistance-inductance-capacitance (RLC) meter or an Ohm meter.

SUMMARY OF THE INVENTION

It has been recognized that it would be advantageous to develop a method and apparatus for accurately measuring an unknown impedance in-circuit, without removing components from the circuit.

The invention provides an in-circuit impedance measurement method and device to measure an unkown impedance in an electrical circuit between first and second nodes. The method and device advantageously accurately measures the impedance in-circuit, without removing components from the circuit. The method and apparatus of the present invention advantageously isolate a single impedance between the two nodes of the circuit from the remaining circuitry by probing the two nodes, and probing at a common node where the current is the same as the current between the first two nodes.

The device includes at least one current source which provides respective first and second currents or current signals of known values. Preferably, first and second current sources may be provided. The currents may be different or applied at different times. Preferably, the currents are good quality sine waves.

First and second probes are connected to the current source or respective first and second current sources. The first and second probes contact the respective first and second nodes to apply the first and second currents to the first and second nodes. A third common probe is connected to the current source, or first and second current sources, to contact the circuit at a common node at a location that has an equal current flow as between the first and second nodes.

At least one voltage meter is connected to the first and second nodes to measure voltages corresponding to the first and second currents. Preferably, first and second voltage meters are provided. The first voltage meter measures two separate voltages at the first node due to the first current source and the second current source. Similarly, the second voltage meter measures two separate voltages at the second node due to the first current source and the second current source.

In accordance with one aspect of the present invention, the first and second voltage meters may be connected to the respective first and second probes, and to the third common probe. Alternatively, fourth and fifth probes may connect the first and second voltage meters to the first and second nodes, while a sixth common probe connects the first and second voltage meters to the circuit at the common node at the location that has an equal current flow as between the first and second nodes.

In accordance with another aspect of the present invention, a signal processor may be coupled to the voltage meters to isolate the voltages measured by the voltage meters caused by the first and second currents. In addition, the signal processor may calculate the impedance of the component based on the known values of the first and second currents and the measured voltages.

In accordance with another aspect of the present invention, the first and fourth probes may be disposed on a first single probe body, but define separate electrical paths with separate electrical contact points. Similarly, the second and fifth probes may be disposed on a second single probe body, but define separate electrical paths with separate electrical contact points. In addition, the third and sixth probes may be disposed on a third single probe body, but define separate electrical paths with separate electrical contact points.

In accordance with another aspect of the present invention, the device may be self-calibrating. A reference resistor may be selectively connected to the current sources and voltage meters by at least one switch.

In accordance with another aspect of the present invention, an internal shunt may be provided for situation or circuits in which no pi network is available. The current sources may include a plurality of unbalanced resistors to create the internal shunt.

In accordance with another aspect of the present invention, the current may be measured or determined to verify proper contact between the probes and the circuit.

A method for measuring the impedance of the discrete component includes selecting a common node at a location that experiences an equal current flow with respect to the component or the impedance between the two nodes. In addition, the method includes applying the first and second currents or current signals of known values at the respective first and second nodes. The current may be applied to the circuit by contacting the first and second nodes with the respective first and second probes, and contacting a common node with the third common probe. The currents applied may be different first and second current signals. In addition, the first and second currents may be applied at different times.

Four voltages are measured, including two voltages at each of the first and second nodes, corresponding to the first and second current sources. Measuring the four voltages may include measuring (1) the voltage between the first and common nodes caused by the first current; (2) the voltage between the first and common nodes caused by the second current; (3) the voltage between the second and common nodes caused by the first current; and (4) the voltage between the second and common nodes caused by the second current. The voltages may be measured by contacting the first and second nodes with the respective fourth and fifth probes, and contacting a common node with the sixth common probe.

The impedance of the component is calculated based on the known values of the first and second currents, and the measured values of the four voltages. The component is treated as a cross member of a pi network. The remaining circuitry and measurement probes are treated as side shunts of the pi network containing the parallel effects of all components in the circuit and the loading of the probes. The voltages corresponding to the first and second currents may be separated or isolated from each other and from any noise.

In accordance with another aspect of the method of the present invention, the impedance of the component may be measured while the circuit is active. The circuit is first activated and system signals present in the circuit are analyzed. Frequencies for the currents are selected which will not conflict with the system signals, or which will have predictable conflicts with the system signals prior. The voltages caused by the currents may then be separated or isolated.

In accordance with another aspect of the method of the present invention, the device may be calibrated by switching the current sources and voltage meters to a reference resistor.

In accordance with another aspect of the method of the present invention, the contacts between the probes and the circuit may be verified by measuring or determining the current. In accordance with another aspect of the method of the present invention, an internal shunt may be provided by unbalancing a plurality of resistors forming the current sources.

Additional features and advantages of the invention will be apparent from the detailed description which follows, taken in conjunction with the accompanying drawings, which together illustrate, by way of example, features of the invention.

DETAILED DESCRIPTION

Figure 1:
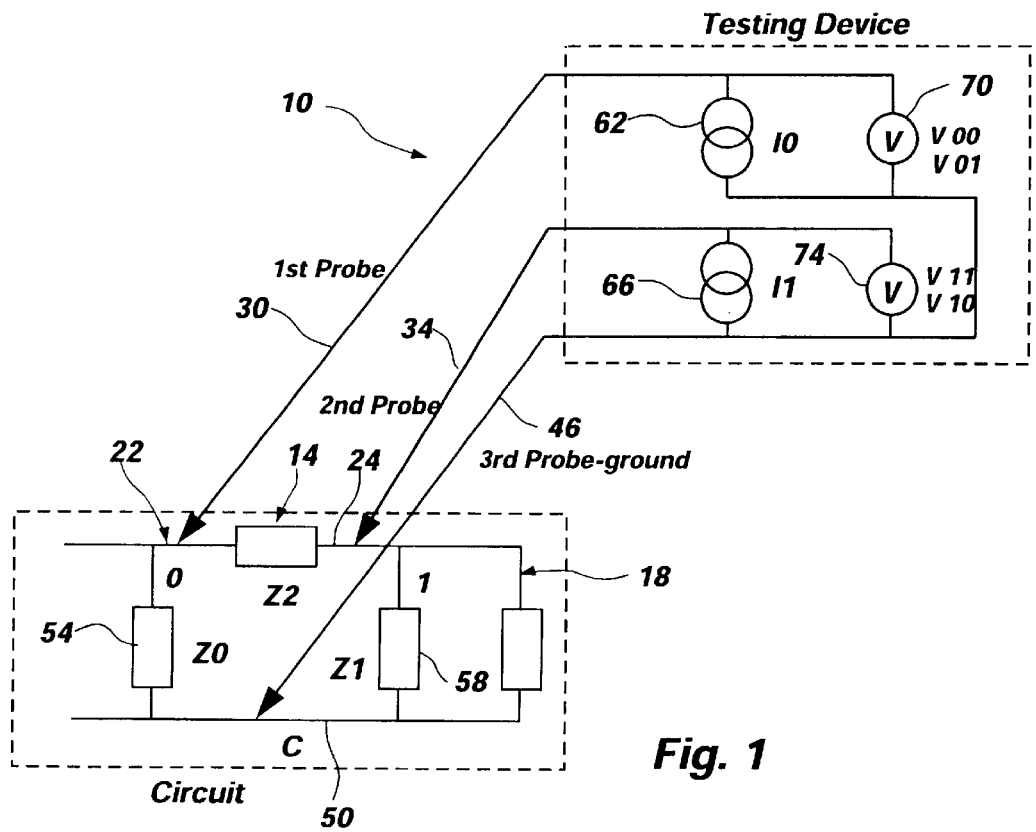
FIG. 1 is a schematic of an impedance measurement device in accordance with the present invention shown with an exemplary component in an exemplary circuit.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 2:
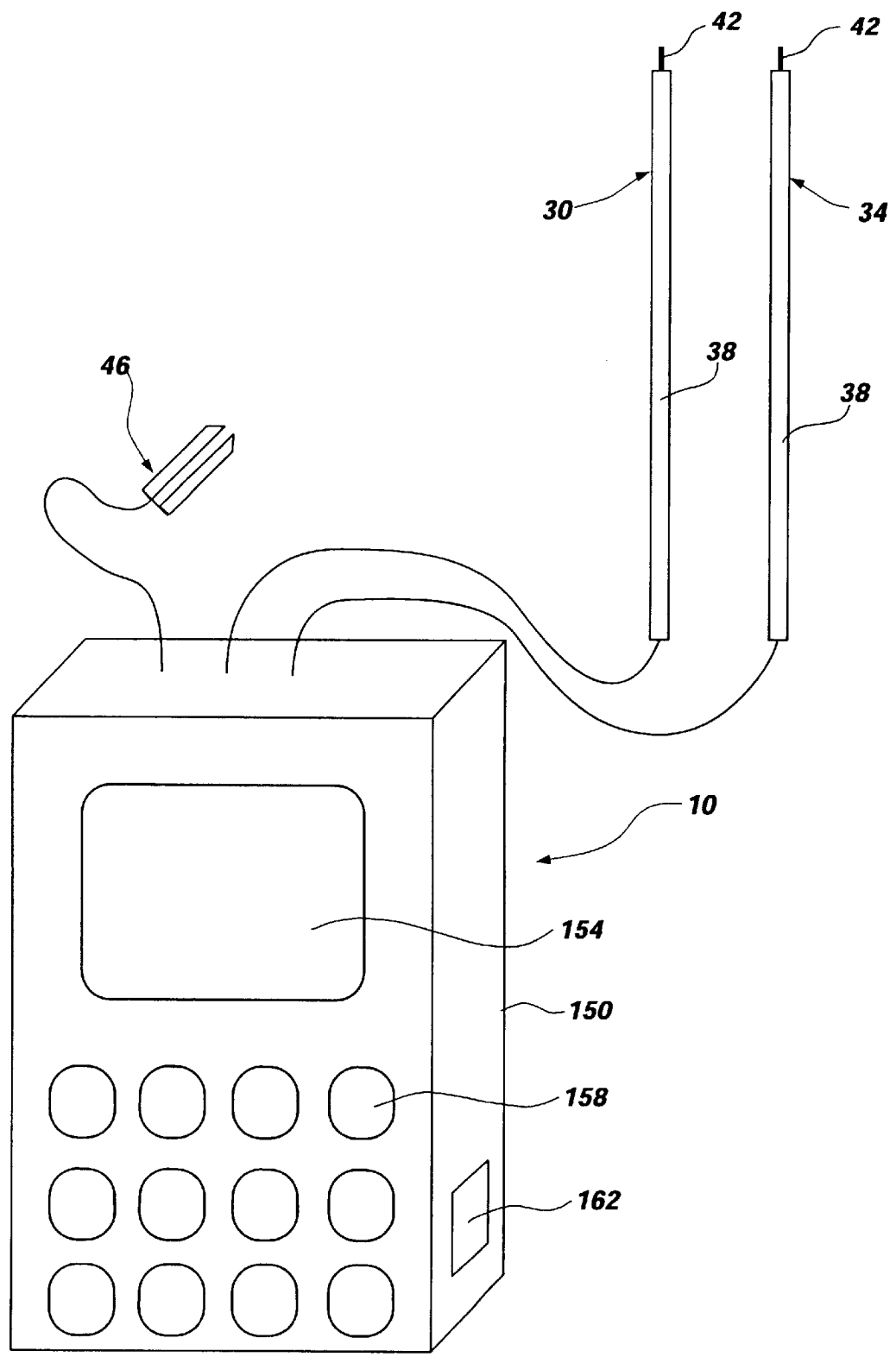
FIG. 2 is a perspective view of the impedance measurement device of the present invention.

As illustrated in FIGS. 1 and 2, an in-circuit, impedance measurement device, indicated generally at 10, in accordance with the present invention is shown for measuring the impedance between first and second nodes, or of an electrical component 14 which is coupled in an electrical circuit 18. Electrical testing is one example of a field which may benefit from use of such an apparatus 10 for checking or testing electrical components while in a circuit. Other characteristics of the component 14, such as resistance, inductance, or capacitance, may be determined from the component's impedance.

Components are the building blocks for forming circuits, and include for example, resistors, capacitors, inductors, delay lines, amplifiers, logical gates, and integrated circuits.

Components have terminals for use in connecting the components. Circuits are formed by a plurality of interconnected components which operate to perform functions. The points at which the components are connected in a circuit are called nodes. Circuits perform functions by receiving input signals on one or more selected input nodes to produce output signals on one or more select output nodes. These input and output nodes are called external nodes. In addition, circuits typically include internal nodes which are the connection points for components.

The component 14 is connected to the circuit 18 through its terminals at first and second nodes 22 and 24. The first node 22 is designated as "0," while the second node is designated as "1." The component 14 also has an impedance, designated "$Z_2$," which is unknown and desired to be measured.

The device 10 includes at least first and second measurement probes 30 and 34 to contact and form an electrical connection with the respective first and second nodes 22 and 24. The probes 30 and 34 may be similar to typical probes, and have insulating probe bodies 38 which may be grasped by a user's hand, and distal contact points 42 on the ends of the probe bodies 38 for contacting the nodes 22 and 24. Thus, a user may grasp the probe bodies 38 and contact the desired nodes of the desired component with the contact points 42. Alternatively, the first and second probes 30 and 34 may be any other type of probe, such as an alligator clip, pin, etc.

In addition, the device 10 includes at least a third common or ground probe 46 for contacting and forming an electrical connection at a common or ground node 50, designated as "c," different from the first and second nodes 22 and 24. The common node 50 is selected at a location where the current flow is the same as through the component or between the first and second nodes. The common node 50 or location where the current flow is the same can be selected using Kirchhoff's law. For example, The third common probe 46 may be a typical alligator clip type probe which may be attached or fastened to the circuit 18 or common node 50. Thus, a user may connect the third common probe 46 to the common node 50, and manipulate the first and second probes 30 and 34 to contact the first and second nodes 22 and 24 of the component 14.

As discussed in greater detail below, the circuit 18 may be conceptualized as a π (pi) network with the desired component 14 forming the cross member of the pi network. Side shunts 54 and 58, designated as "0" and "1," of the pi network may be treated as containing the parallel effects of all other components in the circuit 18, as well as the loading of the measurement probes 30, 34 and 46, or loading of the entire system, including the imperfections in current sources, voltage meters, probes, range control loading, etc.

The device 10 also includes first and second current sources 62 and 66 electrically connected to the respective first and second probes 30 and 34. The first and second current sources 62 and 66 provide or supply respective first and second currents or current signals $i_0$ and $i_1$ of known value. The first and second currents $i_0$ and $i_1$ are applied to the respective first and second nodes 22 and 24 through the first and second probes 30 and 34. Thus, the device 10 injects first and second currents $i_0$ and $i_1$ through the component 14 from the first and second nodes 22 and 24.

Preferably, the current sources 62 and 66 provide different current signals, which allows the currents $i_0$ and $i_1$ to be separated or isolated, as discussed below. In addition, the current sources 62 and 66 preferably supply good quality sine waves. It is believed that a combination of sinusoids, namely 100 rad/sec, 3000 rad/sec and 100,000 rad/sec, will provide the best results. It is believed that low frequencies are best when the component 14 is a capacitor or high value resistor, while high frequencies are best when the component 14 is a low value inductor.

The device 10 also includes first and second voltage meters 70 and 74 for measuring the voltage at the respective first and second nodes 22 and 24 due to the currents $i_0$ and $i_1$. The voltage meters 70 and 74 may be connected to the first and second nodes 22 and 24 by the first and second probes 30 and 34, and to the third common node 50 by the third common probe 46, as shown in FIG. 1. Thus, the first current source 62 and first voltage meter 70 utilize the same first probe 30 or electrical connection, while the second current source 66 and second voltage meter 74 utilize the same second probe 34, or electrical connection.

Figure 3:
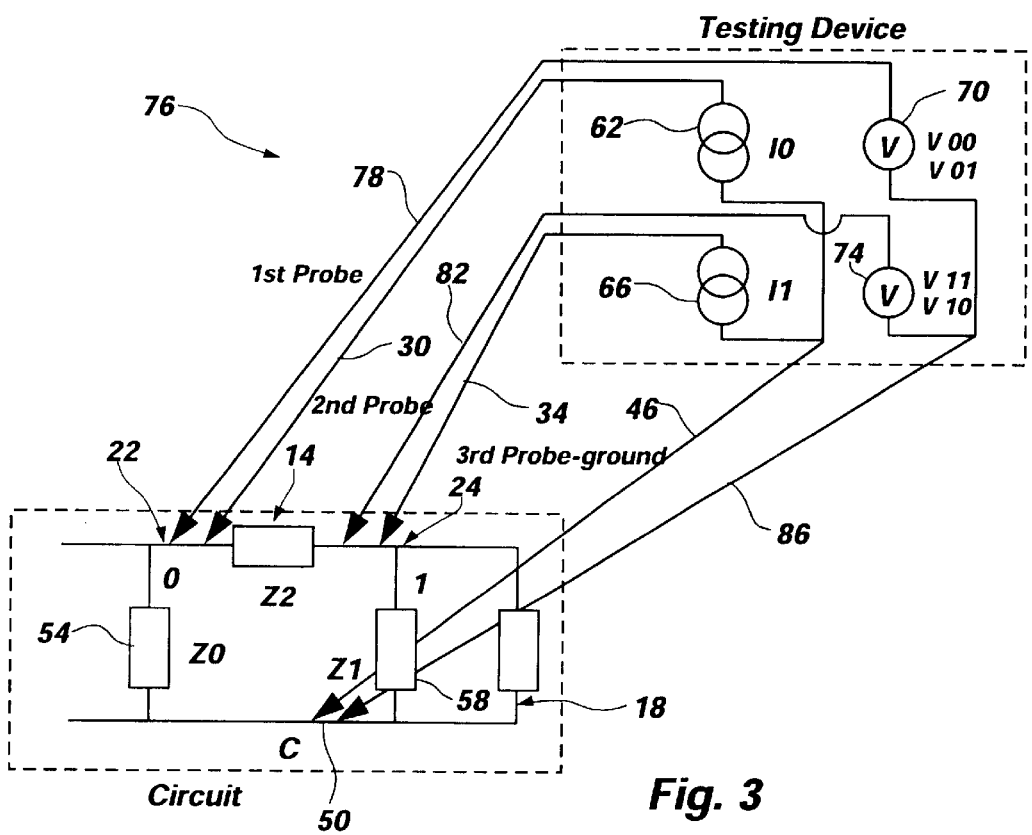
FIG. 3 is a schematic view of another impedance measurement device in accordance with the present invention shown with the exemplary component in the exemplary circuit.

Alternatively, referring to FIG. 3, another device 76 is shown in which the first and second voltage meters 70 and 74 may be connected to the first and second nodes 22 and 24 by respective fourth and fifth probes 78 and 82, and connected to the common node 50 by a sixth common probe 86. Thus, the voltage meters 70 and 74 are connected to the circuit 18 separate from the current sources 62 and 66. It is believed that the accuracy can be enhanced by using different connections for the current sources 62 and 66 and the voltage meters 70 and 74.

The voltage meters 70 and 74 measure four voltages, including two voltages at each node 22 and 24. Specifically, the first voltage meter 70 measures the voltage at the first node 22 (or across the first shunt 54) due to (1) the first current $i_0$, designated as $V_{00}$, and (2) the second current $i_1$, designated as $V_{01}$. Similarly, the second voltage meter 74 measures the voltage at the second node 24 (or across the second shunt 58) due to (1) the second current $i_1$, designated as $V_{11}$, and (2) the first current $i_0$, designated as $V_{10}$. Thus, the voltage meters 70 and 74 measure the voltages $V_{00}$, $V_{01}$, $V_{11}$ and $V_{10}$ at the two nodes 22 and 24 due to the two currents $i_0$ and $i_1$.

Figure 5:
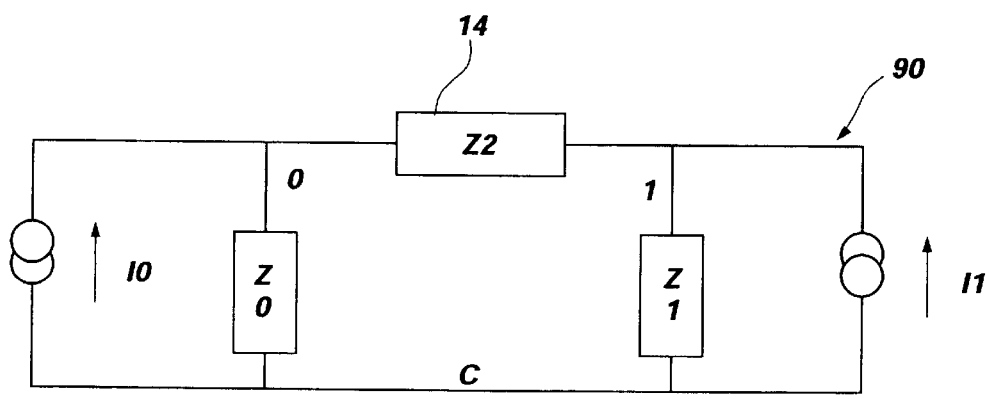
FIG. 5 is a schematic view of an electrical circuit used to calculate the impedance of the component.

Referring to FIG. 5, an electrical circuit 90 is shown which is used to calculate the impedance $Z_2$ of the component 14. The electrical circuit 90 is representative of the circuit 18 containing the component 14, including all of the components in the circuit 18, as well as the loading of the measurement probes 30, 34 and 50 (and 78, 82 and 86), or the loading of the entire system, including the imperfections in the current sources 62 and 66, voltage meters 70 and 74, probes, range control loading, etc. Thus, the circuit 90 may be considered an equivalent circuit made up of both the circuit 18 and the testing device 10. It has been recognized that the component 14 in the circuit 18 can be accurately measured in the circuit 18 by conceptualizing the component 14 as the cross member of a π (pi) network. The side shunts 54 and 58 contain the parallel effects of all components in the circuit 18, as well as the loading of the probes 30, 34 and 46 (and 78, 82 and 86), of the entire device.

All the elements or components of the circuit 18 and the device 10 may be lumped as parallel combinations into pseudo-components or side shunts 54 and 58 of the pi network, designated as "0" and "1," with shunt impedances $Z_0$ and $Z_1$ by careful selection of the nodes. Since signal processing can be used to accurately separate the voltages, very low values of the shunt impedances $Z_0$ and $Z_1$ can be tolerated, and these values do not need to be known. In fact, the value for the shunt impedances $Z_0$ and $Z_1$ can be in the milliohm range if separate connections are made for monitoring the voltages and supplying the currents, as shown in FIG. 3, to avoid contact resistance errors. The impedances are in the range of short printed traces or vias found in common electronic systems. Therefore, it is possible to isolate the impedance $Z_2$ of the component 14 from all other parallel paths by using the shunt impedance $Z_0$ or $Z_1$ as an interconnecting trace. This allows the measurement of a single component when connected in parallel with other elements.

The shunt impedances $Z_0$ and $Z_1$ are removed from the solution by solving for the impedance $Z_2$ of the component 14 with the measured voltages $V_{00}$, $V_{01}$, $V_{11}$ and $V_{10}$ and known currents $i_0$ and $i_1$. As stated above, the test device 10 applies known currents $i_0$ and $i_1$, and measures voltages $V_{00}$, $V_{01}$, $V_{11}$ and $V_{10}$ caused by those currents. The voltage $V_{00}$ at the first node 22 or "0" (or across the first shunt 54) due to the current $i_0$ from the first current source applied at the first node 22 or "0" can be calculated by:

$$V_{00} = i_0 \frac{1}{\frac{1}{Z_0} + \frac{1}{Z_1 + Z_2}} \tag{1}$$

Similarly, the voltage $V_{11}$ at the second node 24 or "1" (or across the second side shunt 58) due to the current $i_1$ from the first current source applied at the second node 24 or "1" can be calculated by:

$$V_{11} = i_1 \frac{1}{\frac{1}{Z_1} + \frac{1}{Z_0 + Z_2}} \tag{2}$$

The voltage $V_{01}$ at the first node 22 or "0" (or across the first side shunt 54) due to the current $i_1$ from the second current source applied at the first node 22 or "0" can be calculated by:

$$V_{01} = V_{11} \frac{Z_0}{Z_0 + Z_2} \tag{3}$$

Similarly, the voltage $V_{10}$ at the second node 24 or "1" (or across the second side shunt 58) due to the current $i_1$ from the first current source applied at the second node 24 or "1" can be calculated by:

$$V_{10} = V_{00} \frac{Z_1}{Z_1 + Z_2} \tag{4}$$

From equation (4), the impedance $Z_2$ of the component 14 may be expressed as:

$$Z_2 = Z_1 \frac{(V_{00} - V_{10})}{V_{10}} \tag{5}$$

Similarly, from equation (3), the impedance $Z_2$ of the component 14 may be expressed as:

$$Z_2 = Z_0 \frac{(V_{11} - V_{01})}{V_{01}} \tag{6}$$

Equation (1) may be arranged as:

$$V_{00} = i_0 \frac{Z_0(Z_1 + Z_2)}{Z_0 + Z_1 + Z_2} \tag{7}$$

Equation (6) may be arranged as:

$$Z_0 = \frac{Z_2 V_{01}}{(V_{11} - V_{01})} \tag{8}$$

Equation (5) may be arranged as:

$$Z_1 = \frac{Z_2 V_{10}}{(V_{00} - V_{10})} \tag{9}$$

The shunt impedances $Z_0$ and $Z_1$ from equations (8) and (9) may be substituted into equation (7) as follows:

$$V_{00} = \frac{i_0 Z_2 \frac{V_{01}}{(V_{11} - V_{01})} \left[1 + \frac{V_{10}}{(V_{00} - V_{10})}\right]}{1 + \frac{V_{10}}{(V_{00} - V_{10})} + \frac{V_{01}}{(V_{11} - V_{01})}} \tag{10}$$

Equation 10 may be simplified as follows:

$$V_{00} = \frac{i_0 Z_2 V_{01}[V_{00} - V_{10} + V_{10}]}{(V_{11} - V_{01})(V_{00} - V_{10}) + V_{10}(V_{11} - V_{01}) + V_{01}(V_{00} - V_{10})} \tag{11}$$

Equation (11) may be further simplified as follows:

$$V_{00} = i_0 z_2 \frac{V_{01} V_{00}}{V_{11} V_{00} - V_{10} V_{01}} \tag{12}$$

Equation (12) may be rearranged to solve for the impedance $Z_2$ of the component 14 as follows:

$$Z_2 = \frac{1}{i_0} \left[\frac{V_{11} V_{00}}{V_{01}} - V_{10}\right] \tag{13}$$

Alternatively, by symmetry, the impedance $Z_2$ may be expressed as:

$$Z_2 = \frac{1}{i_1} \left[\frac{V_{11} V_{00}}{V_{10}} - V_{01}\right] \tag{14}$$

Equations (13) and (14) express the unknown impedance $Z_2$ in terms of the known currents $i_0$ and $i_1$, and measured voltages $V_{00}$, $V_{01}$, $V_{11}$ and $V_{10}$. Thus, equations (13) and/or (14) may be utilized by the device 10 to calculate the impedance $Z_2$ of the component 14.

It can be observed from equation (13) that there is a voltage transfer function $V_{11}/V_{01}$ imbedded within the equation, and that there is no explicit involvement of the second current $I_1$. The transfer function voltages $V_{11}$ and $V_{01}$ were generated as a result of the injection of current $I_1$, but the equation infers an alternative method. A voltage could be applied directly to the second node 24, or node 1, which would be $V_{11}$, and then measure $V_{01}$ which would be the voltage measured at the first node 22, or node 0, as a result of $V_{11}$. Thus, only three voltages need to be measured. The design may be simplified by substituting a voltage source for a more complex current source, but doing so may break the symmetry, and may create unknown and potentially large currents flowing in the circuit under test due to the effect of shorting a node by means of a voltage source. The above commentary also can be made for equation (14) by the principal of symmetry.

The current sources 62 and 66 and voltage meters 70 and 74 will have some shunt impedance. This non-ideal shunt impedance advantageously does not interfere with the measurement of the impedance $Z_2$ of the component 14.

Figure 4:
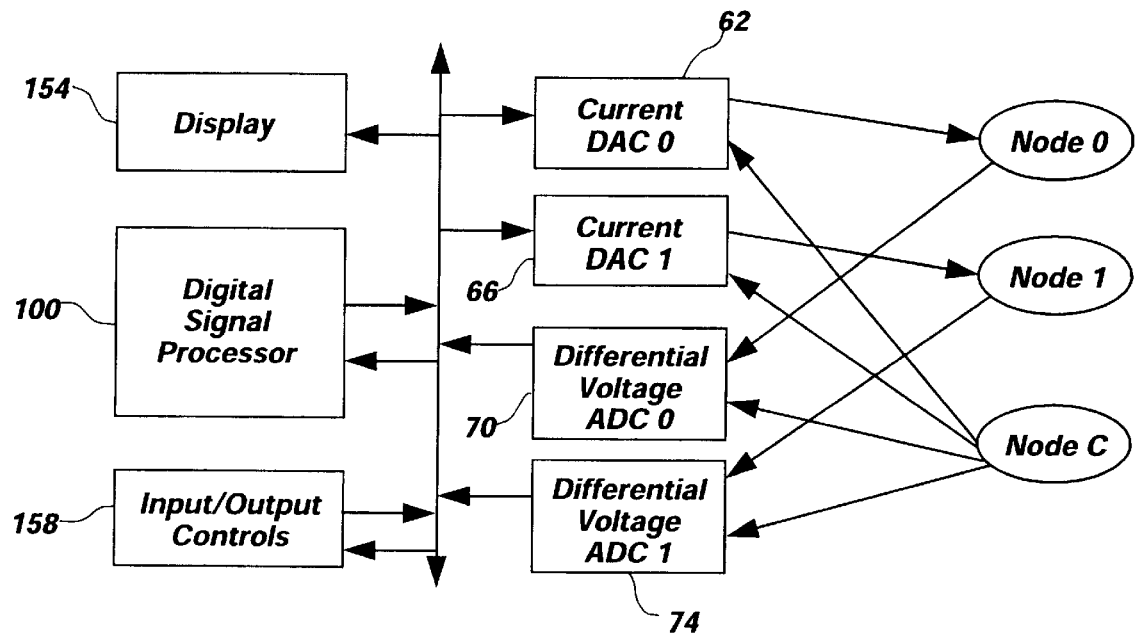
FIG. 4 is a schematic view of the impedance measurement device in accordance with the present invention.

Referring to FIG. 4, the device 10 may include a signal processor 100, such as a digital signal processor, connected to the voltage meters 70 and 74. The signal processor 100 may perform calculation functions, such as calculating the impedance $Z_2$ of the component 14 utilizing equations (13) or (14). In addition, the signal processor 100 may be used to isolate the measured voltages from noise, and from each of the voltages caused by the separate current signals $i_0$ and $i_1$. Furthermore, the signal processor 100 may be connected to the current sources 62 and 66, and generate the current signals $i_0$ and $i_1$.

Using signal processing and high dynamic range voltage measurements, one shunt side of the pi network can be a short length of copper circuit trace or via. Although the impedance can be very small, it can be measured sufficiently accurately to allow isolation of the component's value even if in parallel with multiple components.

As indicated above, the currents $i_0$ and $i_1$ may be good quality sine waves. The voltages at the nodes 22 and 24 caused by these sine waves can then be filtered to a narrow bandwidth. This allows for the separation of measured voltages across the component 14 from noise and from the two separate current sources 62 and 66. In addition, it is possible to apply the currents $i_0$ and $i_1$ at different times.

The sine waves may be detected by a narrow band filter, with a bandwidth on the order of 1 to 10 Hz. The filter could be implemented using fast Fourier transforms (FFT), finite impulse response (fir), or infinite impulse response (iir), type filtering depending on how many sine waves are used. As discussed above, low frequencies are preferable for capacitors and high valued resisters, while high frequencies are preferred for low value inductors.

All capacitors and inductors contain a small series resistance. By using a combination of frequencies and complex math, this series resistance can be calculated as a secondary component parameter that may be useful. The primary value of inductance, capacitance and resistance can be calculated using commonly understood impedance equations.

The bandwidth is inversely proportional to the rate of measurement. Wider bandwidths may be used, but there is a tradeoff of speed and dynamic range which may be utilized.

Referring to FIGS. 2 and 4, the device 10 may include a housing 150 to contain the current generating circuitry, voltage measurement circuitry, and signal processing. The housing 150 preferably is sized to be hand-held, and free standing. Thus, the device 10 may be portable for ease of use, and leave the user's hands free to manipulate the probes. The device 10 also may include a display 154, input controls 158, and an output port. The display 154 may be utilized for displaying the calculated inductance $Z_2$ of the component 14, other calculated characteristics of the component, provide instructions and options, etc. Thus, the display 154 may be electrical, such as an LCD type display, or mechanical, such as a needle. The input controls 158 may be buttons or a keypad to receive instructions from a user and control operation of the device 10. The output port 162 may be a standard communication port for connecting or transferring data to a computer, etc. The output port also may be an input port for connecting the device 10 to a keyboard or other computing device.

Figure 6:
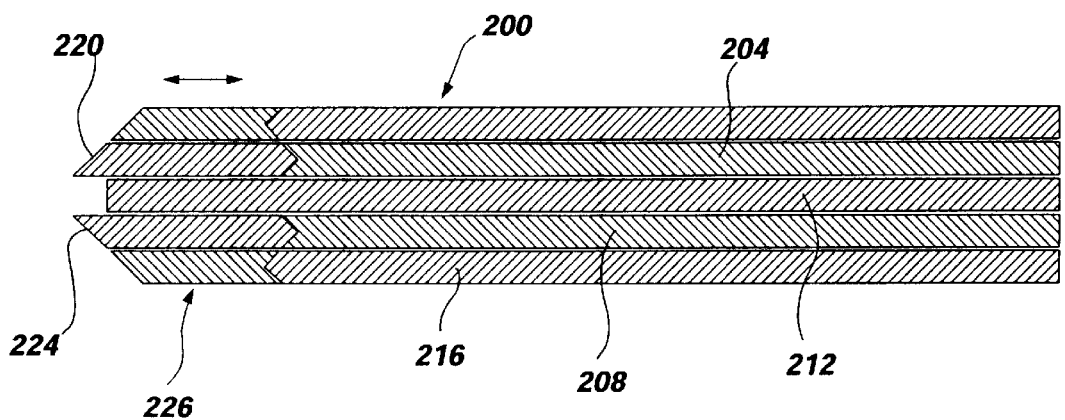
FIG. 6 is a cross-sectional side view of a probe of the impedance measurement device of the present invention.

Referring to FIG. 6, a probe 200 is shown which may be utilized for any of the first or second probes 30 and 34, or third common probe 50, as well as the fourth and fifth probes 78 and 82, and sixth common probe 86. The probe 200 advantageously combines the probe for applying the current, such as first probe 30, and the probe for measuring the voltage, such as fourth probe 78, into a single probe, but with separate electrical paths. Thus, the probe 200 may be easily manipulated and handled by a user, while providing separate electrical connections for the current source and voltage meter.

The probe 200 has first and second electrical paths 204 and 208 which are separated from one another by an insulated wall 212. The separate electrical paths 204 and 208 may be utilized by the first and fourth probes 30 and 78, the second and fifth probes 34 and 82, or the third and sixth common probes 50 and 86. An insulated probe body 216 surrounds the electrical paths 204 and 208, which may be grasped by a user. The probe 200 and electrical paths 204 and 208 terminate in separate first and second contact points or tips 220 and 224. Thus, the probe 200 and/or probe tips 220 and 224 may be laminated probe tips, or formed of three layers. Two outside layers 204 and 208 are conductive, such as stainless steel, while the inner layer 212 is nonconductive, such as a thermoset plastic. The inner layer 212 may have a thickness of approximately 0.005 to 0.003 inches thick. The three layers 204, 208 and 212 may be formed together by laminating the three layers together with a heated platten press. The probe 200 or tips 220 and 224 may be cut out of the sheet by chemical etch.

The contact points 220 and 224 preferably have a sharp point or edge which allows the points 220 and 224 to break through the oxide layer that tends to build up on metals. The distal end of the probe 200 preferably has a removable tip end 226 which is removably attached to the probe 200. Thus, as the contact points 220 and 224 become worn or dull, the removable tip end 226 may be removed from the probe 200 and replaced with a new tip end with sharp points. Therefore, as the contact points 220 and 224 wear, only the tip end 226 needs to be replaced, while the probe 220, cable and connectors may still be used.

Figure 7:
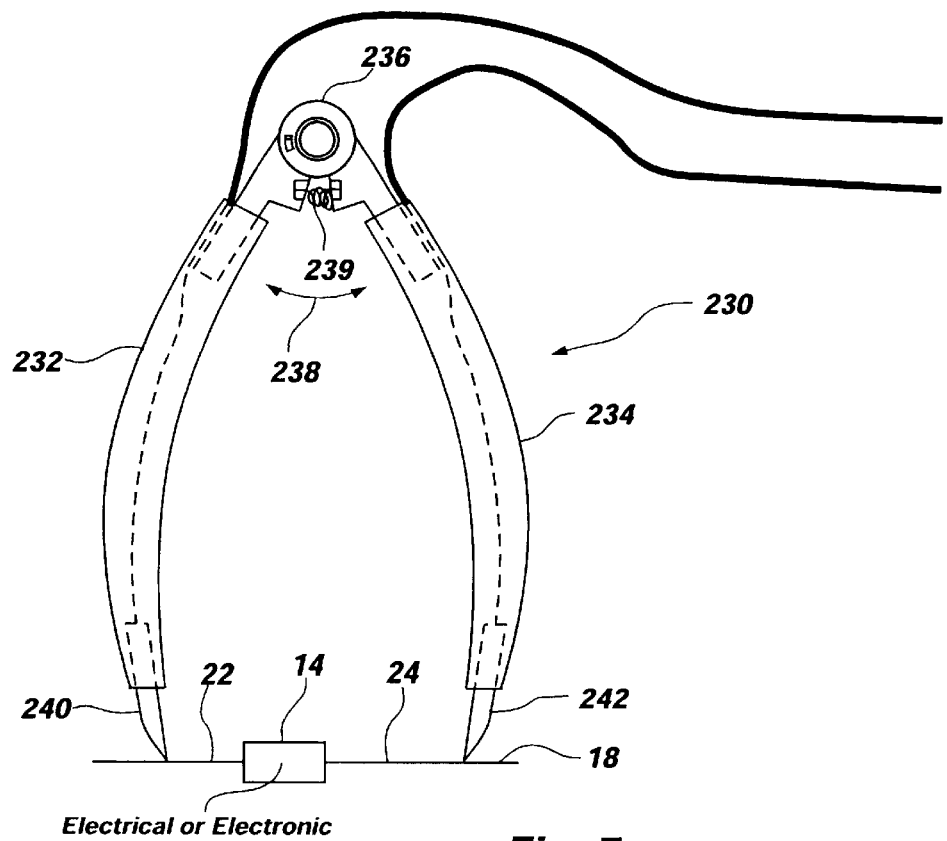
FIG. 7 is a side view of another probe of the impedance measurement device of the present invention.

Referring to FIG. 7, a probe 230 combines the first and second probes 30 and 34 to allow the user to grasp the single probe 230 and contact both sides of the component 14, or the first and second nodes 22 and 24, simultaneously. The probe 230 has a tweezer like configuration with a pair of arms 232 and 234 pivotally coupled or hinged at a pivot 236 at distal ends so that the arms may pivot towards and away from one another, or open and close, indicated by arrow 238. A spring member 239 may be disposed between the arms 232 and 234 to bias the arms 232 and 234 away from one another so that the user may grasp the arms 232 and 234 and squeeze them together to make the appropriate contacts. Contact points or probe tips 240 and 242 are disposed at the proximal ends of respective arms 232 and 234 for contacting the respective first and second nodes 22 and 24. The probe tips 240 and 242 may be similar to the probe 200 with laminated probe tips 220 and 224 described above. Thus, the first arm 232 may include the first and fourth probes 30 and 78, while the second arm 234 includes the second and fifth probes 34 and 82. Therefore, the user may use one hand to manipulate the probe 230 to make four contacts (first, second, fourth and fifth probes 30, 34, 78 and 82) at the first and second nodes 22 and 24, while using the other hand to contact the common node 50 with the third probe 46.

In addition, the device 10 may measure current to verify that the contacts made by the probes are valid. Current meters may be provided to measure the current output and the current returned. The current measurements are not required for the measurement of the unknown impedance, but to verify that the contacts are valid.

Figure 8:
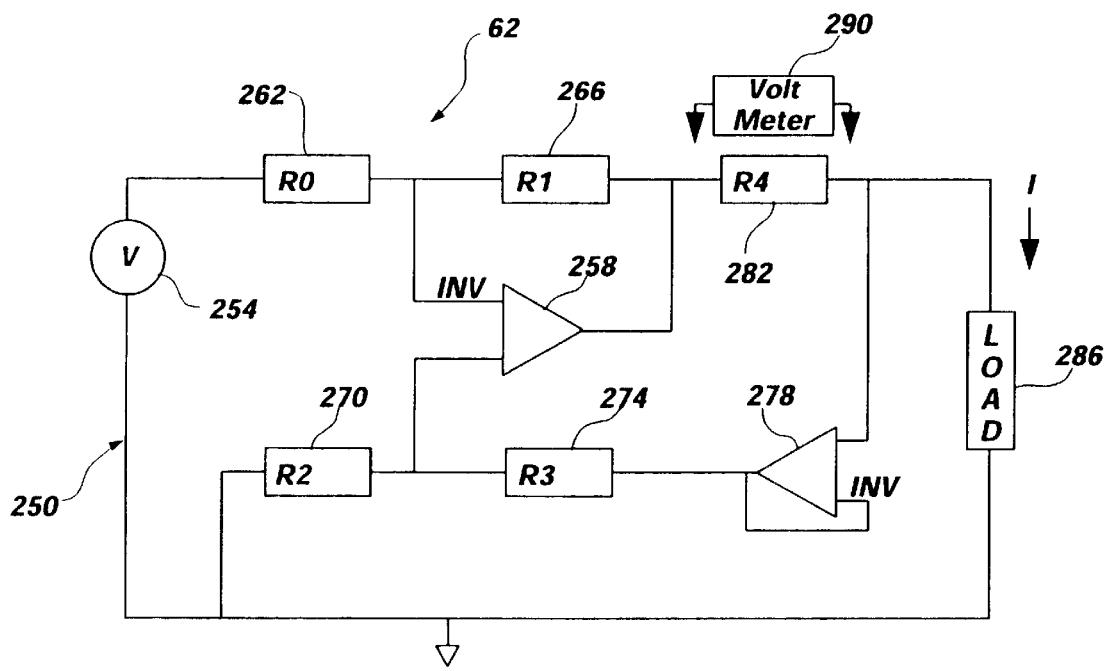
FIG. 8 is a schematic view of a current source in accordance with the present invention.

Referring to FIG. 8, the current sources 62 and 66, represented by the first current source 62, may be created with circuitry 250 using operational amplifiers and resistors. A voltage source 254 provides a signal to an inversing input of a first operational amplifier 258 through a first resistor 262, designated $R_0$. The output signal of the operational amplifier 258 also is provided to the inversing input through a second resistor 266, designated $R_1$. The other input of the operational amplifier 258 is connected to third and fourth resistors 270 and 274, designated $R_2$ and $R_3$. The third resistor 270 also is connected to the voltage source 254. The output of the operational amplifier 258 also is provided to the input of a second operational amplifier 278 through a fifth resister 282, designated $R_4$. The output of the second operational amplifier 278 is provided to the inversion input of the second operational amplifier 278, and the input of the first operational amplifier 258 through the fourth resistor 274. A load 286 is connected to the output of the first operational amplifier 258 through the fifth resistor 282, and to the voltage source 254 or ground. A voltage meter 290 may measure the voltage across the fifth resistor 282, or $R_4$.

Using the voltage meter 290 to measure the voltage across the fifth resister 282, or $R_4$, allows the current to be measured to verify that proper contacts have been made. The output current I is given by $I=-R_1*V/R_0/R_4$. The output impedance is infinite if $R_0=R_2$ and $R_{1=R3}$ because the voltage across $R_4$ does not depend on the voltage at the load. The current I can be monitored by measuring the voltage across $R_4$ and then dividing the voltage by $R_4$.

The above discussion has assumed that the component 14 to be measured can be conceptualized as the cross member of a pi network. It will be appreciated, however, that situations or circuits may exist in which the desired component is an isolated single element without shunting sides, or without a pi network. The lack of a pi network causes the problem of current sources driving into each other although separated by the unknown component. For ideal circuits, the resultant voltages would be infinite. Although the current sources are not ideal, the signal levels can become out of range to the analog-to-digital converters. Thus, the measurement device advantageously may be provided with internal shunt loads which are switched on to form a pi network. The measurement device detects such a situation by the low current out to high voltage measurement ratio. The device may then switch on the internal shunt loads. Again, the shunt loads do not have to be accurately known, but only large compared to the contact resistance so not to introduce significant error voltages across the contact resistance. The internal shunt impedances will construct the pi network internally, or partially internally, and allow the voltages to stay within the dynamic range.

The internal shunt impedances may be provided by making the current sources 62 and 66 less perfect, or by unbalancing the resistors described above, to produce the shunts. To reduce the output impedance, the balance between the resistors $R_0$, $R_1$, $R_2$ and $R_3$ can be upset. Thus, the voltage across $R_4$ becomes dependent on the voltage across the load. If $R_2$ is zero ($R_2=0$) and/or $R_3$ is infinite ($R_3=$), then $R_4$ is the output impedance. The feedback balance may be upset by 10% so that the approximate output impedance when unbalanced is 10 times the value of $R_4$. The current used in the calculations remains as above, but the shunt impedance changes. The shunt impedance effect is removed by the as described above.

Figure 9:
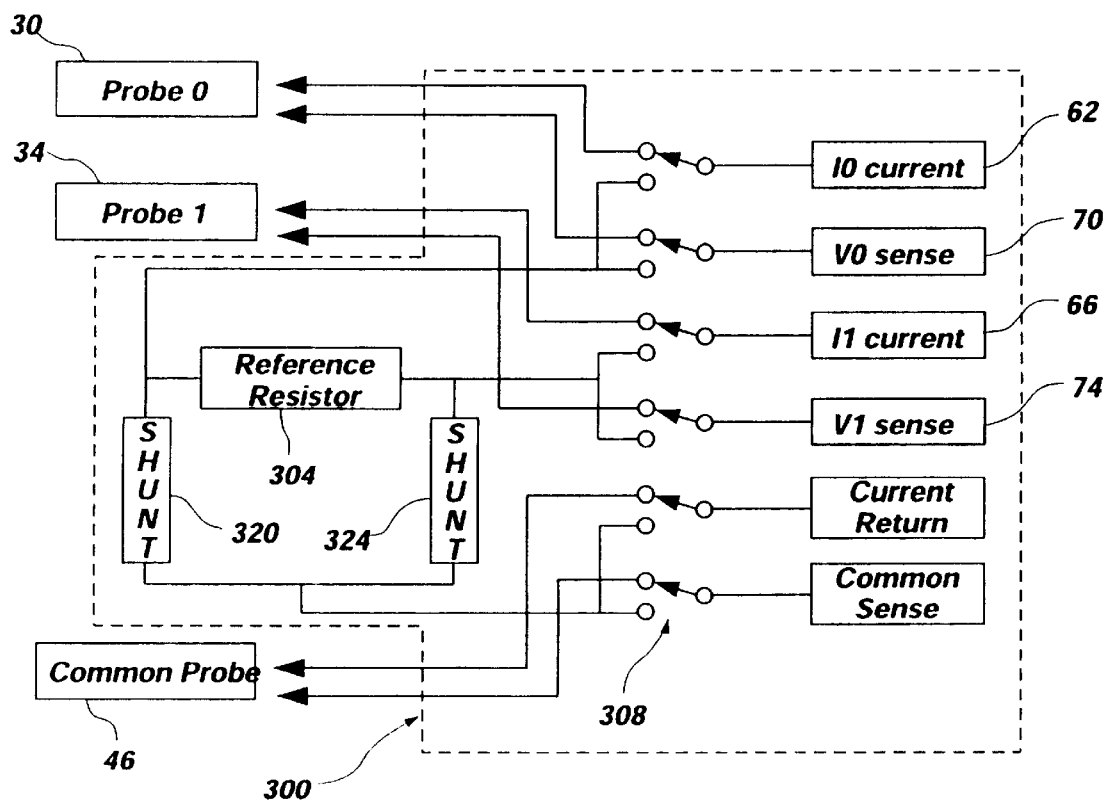
FIG. 9 is a schematic view of another impedance measurement device in accordance with the present invention.

Referring to FIG. 9, an impedance measurement device 300, similar to that described above, may be self-calibrating. A reference resistor 304 may be disposed in the device 300 and electrically coupled to the circuitry of the device. The reference resistor 304 is switched into the measurement position, instead of the probes 30, 34 and 36, for a short time when the device 300 is powered on to calibrate the device 10. A plurality of relays 308 may be used to switch the circuitry, or the current sources 62 and 66, and voltage meters 70 and 74, from the probes 30, 34 and 46 (and 78, 82 and 86) to the reference resistor 304. Thus, the reference resistor 304 is substituted for the component 14 of the circuit 18. Preferably, each of the probes or contacts are individually switches, such as with six individual relays, so that the relay contact resistance effects are reduced in the same manner as they would be using the six probes.

It will be appreciated that if the ratio of current I and voltage V is accurate, then the absolute accuracy of current and voltage measurements are not critical to the impedance measurement because the voltages are divided by the currents. The ratio of current I and voltage V is accurately calibrated by using a precision reference resistor 304. Preferably, a 1000 ohm reference resistor 304 will be used with an accuracy of 0.01% as a calibration standard. The reference resistor 304 again may be the cross member of an internal pi network with internal shunts 320 and 324. Each measurement range may be calibrated against the reference resistor 304. The analog-to-digital and digital-to-analog converters may be highly linear delta sigma converters. The linearity of the converters with the ratio calibration will maintain a highly accurate reading over the linearity range of the converters.

A method of using the devices 10, 78 and/or 300 described above includes selecting a component or first and second nodes, and selecting a common node at a location that has a concurrent current flow equal in value to the current flow in the component, or between the first and second nodes. As stated above, the common node or location with equal current flow can be selected using Kirchhoff's law. In addition, the method includes applying the first and second currents or current signals $i_0$ and $i_1$ of known values to the respective first and second nodes 22 and 24. The first and second current sources 62 and 66 are used to generate the currents $i_0$ and $i_1$, and may generate different sinusoidal current signals. The first and second probes 30 and 34 may be used to contact the first and second nodes 22 and 24. Similarly, the third common probe 46 may be used to contact the common node 50.

The four voltages are measured using the voltage meters 70 and 74. The two voltages $V_{00}$ and $V_{01}$ at the first node 22 due to the first and second current sources $i_0$ and $i_1$ are measured using the first voltage meter 70. Similarly, the two voltages $V_{11}$ and $V_{10}$ at the second node 24 due to the current sources $i_0$ and $i_1$ are measured with the second voltage meter 74. The first and second probes 30 and 34 may be used to connect the voltage meters 70 and 74 with the nodes 22 and 24. Alternatively, fourth and fifth probes 78 and 82 may be used to connect the voltage meters 70 and 74 to the nodes 22 and 24. Similarly, the sixth common probe 86 may be used to contact the common node 50.

As stated above, the device may first perform a self-calibration by switching the current sources 62 and 66, and the voltage meters 70 and 74 to an internal reference resistor 304, and/or internal pi network with side shunts 320 and 324.

The signal processor 100 may be used to separate the measured voltages $V_{00}$, $V_{01}$, $V_{11}$ and $V_{10}$ due to the first and second current sources $i_0$ and $i_1$.

The impedance $Z_2$ of the component 14 is calculated using the known values of the current $i_0$ and $i_1$, the measured voltages $V_{00}$, $V_{01}$, $V_{11}$ and $V_{10}$, and the formulas described above. As described above, the component 14 may be treated as the cross member of a pi network, and the remaining circuitry and probes as side shunts which contain the parallel effects of all the components in the circuit and the loading of the device 10. Also as described above, the balance of the resistors may be upset to reduce the output impedance, and make the current sources 62 and 66 less perfect, to provide for internal shunts if a pi network cannot be obtained on the circuit 18.

In addition, the current may be measured to insure that proper contacts were made.

Although the device 10 and method have been described with respect to a non-functioning or inactive circuit, the device 10 and method may be utilized with an operating or active circuit. The circuit 18 may first be analyzed to determine which system signals are present, without applying the currents $i_0$ and $i_1$ from the current sources 62 and 66 of the device 10. The analysis may be performed with a fast Fourier transform (FFT). Sinusoidal frequencies may then be selected which have no system conflicts, or predictable system conflicts. These sinusoidal frequencies are used as the current sources or signals $i_{0\ and\ i1}$. The system signals are then measured with the current sources or signals $i_0$ and $i_1$ being applied by the device 10. The voltages caused by the currents $i_0$ and $i_1$ may be extracted and measured. Again, a fast Fourier transform (FFT) may be used. The impedance $Z_2$ may then be calculated as described above. The fast Fourier transform (FFT) can be used to insure linearity of the test by simultaneously observing harmonics of the currents $i_0$ and $i_1$. Levels of the currents or signals $i_0$ and $i_1$ can be adjusted to insure maximum dynamic range and accuracy for a given circuit. The data from the fast Fourier transform also may be used to calculate an error limit on the measured voltages and the calculated impedance $Z_2$. Such an error limit may be displayed to provide a user with accurate limit information for a given component and situation.

It is to be understood that the above-referenced arrangements are only illustrative of the application for the principles of the present invention. Numerous modifications and alternative arrangements can be devised without departing from the spirit and scope of the present invention while the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A device configured to measure an impedance between first and second nodes of an electrical circuit, the device comprising:
   a) at least one current source configured to provide first and second currents of known values;
   b) first and second probes, connected to the at least one current source, and configured to contact the respective first and second nodes to apply the first and second currents to the first and second nodes;
   c) a third common probe, connected to the at least one current source, configured to contact the circuit at a common node at a location that has an equal current flow with respect to the first and second nodes;
   d) at least one voltage meter, configured to be connected to the first and second nodes, to measure voltages corresponding to the first and second currents; and
   e) a processor, operatively coupled to the at least one current source and the at least one voltage meter, capable of calculating the unknown impedance based on the known values of the first and second current and the measured values of the voltages.

2. A device in accordance with claim 1, wherein the at least one current source is configured to provide different first and second current signals.

3. A device in accordance with claim 1, wherein the at least one current source is configured to provide different sinusoidal current signals.

4. A device in accordance with claim 1, wherein the processor is configured to isolate the voltages measured by the at least one voltage meter caused by the first and second currents.

5. A device in accordance with claim 1, wherein the at least one voltage meter is connected to the respective first and second probes, and is connected to the third common probe.

6. A device in accordance with claim 1, further comprising:
   a) a fourth probe, connected to a first voltage meter, and configured to contact the first node;
   b) a fifth probe, connected to a second voltage meter, and configured to contact the second node; and
   c) a sixth common probe, connected to the first and second voltage meters, and configured to contact the circuit at the common node at the location that has an equal current flow with respect to the first and second nodes.

7. A device in accordance with claim 6, wherein the first and fourth probes are disposed on a first single probe body, but define separate electrical paths with separate electrical contact points; and wherein the second and fifth probes are disposed on a second single probe body, but define separate electrical paths with separate electrical contact points; and wherein the third and sixth probes are disposed on a third single probe body, but define separate electrical paths with separate electrical contact points.

8. A device in accordance with claim 1, wherein the first and second probes include a pair of arms pivotally coupled at one end.

9. A device in accordance with claim 1, further comprising:
   a signal processor, connected to the at least one current source and the at least one voltage meter, configured to calculate the impedance of the component based on the known values of the current and measured values of the voltage.

10. A device in accordance with claim 1, wherein the at least one voltage meter includes:
    a) analog-to-digital circuitry configured to convert voltages to digital values; and
    b) wherein the processor includes a digital signal processor, connected to the analog-to-digital circuitry, configured to separate the voltage measurements.

11. A device in accordance with claim 1, further comprising:
    a) an input device configured to receive input from a user to control the device;
    b) a display configured to display information; and
    c) a port configured to transfer data.

12. A device in accordance with claim 1, further comprising:
    a) a reference resistor, selectively connected to the at least one current source and the at least one voltage meter, to calibrate the device; and b) at least one switch, connected between the reference resistor and the at least one current source and the at least one voltage meter, to selectively connect the at least one current source and the at least one voltage meter to the reference resistor or probes.

13. A device in accordance with claim 1, wherein the at least one current source includes a plurality of unbalanced resistors to create an internal shunt.

14. A device in accordance with claim 1, further comprising:
   a measurement device to determine current to verify proper contact.

15. An impedance measurement device, comprising:
   a) a circuit having first and second nodes, and at least one parallel current path which experiences an equal current flow with respect to the first and second nodes;
   b) first and second probes, contacting the respective first and second nodes;
   c) a third common probe, contacting the circuit at a common node at a location that experiences equal current flow with respect to the first and second nodes;
   d) at least one current source, connected to the at least first and second probes, configured to provide first and second currents of known values to be applied to the respective first and second nodes; and
   e) at least one voltage meter, configured to be connected to the first and second nodes, to measure voltages corresponding to the first and second currents.

16. A device in accordance with claim 15, wherein the at least one current source is configured to provide different first and second current signals.

17. A device in accordance with claim 15, wherein the at least one current source is configured to provide different sinusoidal current signals.

18. A device in accordance with claim 15, further comprising:
   a signal processor, coupled to the at least one voltage meter and configured to be connected to the first and second nodes, and configured to isolate the voltages measured by the at least one voltage meter from the first and second currents, and to calculate the impedance of the component based on the known values of the first and second currents and the measured voltages.

19. A device in accordance with claim 15, wherein the at least one voltage meter is connected to the respective first and second probes, and both are connected to the third probe.

20. A device in accordance with claim 15, further comprising:
   a) a fourth probe, connected to the at least one voltage meter, and configured to contact the first node;
   b) a fifth probe, connected to the at least one voltage meter, and configured to contact the second node; and
   c) a sixth common probe, connected to the at least one voltage meters, and configured to contact the circuit at the common location.

21. A device in accordance with claim 20, wherein the first and fourth probes are disposed on a first single probe body, but define separate electrical paths with separate electrical contact points; and wherein the second and fifth probes are disposed on a second single probe body, but define separate electrical paths with separate electrical contact points; and wherein the third and sixth probes are disposed on a third single probe body, but define separate electrical paths with separate electrical contact points.

22. A device in accordance with claim 15, wherein the first and second probes include a pair of arms pivotally coupled at one end.

23. A device in accordance with claim 15, further comprising:
   a signal processor, connected to the at least one current source and the at least one voltage meter, configured to calculate the impedance of the component based on the known values of the current and measured values of the voltage.

24. A device in accordance with claim 15, wherein the at least one voltage meter includes:
   a) analog-to-digital circuitry configured to convert voltages to digital values; and
   b) a digital signal processor, connected to the analog-to-digital circuitry, configured to separate the voltage measurements and calculate the impedance between the first and second nodes based on the known values of the current and measured values of the voltage.

25. A device in accordance with claim 15, further comprising:
   a) an input device configured to receive input to control the device;
   b) a display configured to display information; and
   c) a port configured to transfer data.

26. A device in accordance with claim 15, further comprising:
   a) a reference resistor, selectively connected to the at least one current source and the at least one voltage meter, to calibrate the device; and
   b) at least one switch, connected between the reference resistor and that at least one current source and the at least one voltage, to selectively connect the at least one current source and the at least one voltage meter to the reference resistor or probes.

27. A device in accordance with claim 15, wherein the at least one current source includes a plurality of unbalance resistors to create an internal shunt.

28. A device in accordance with claim 15, further comprising:
   a measurement device to determine current to verify proper contact.

29. A method for measuring an impedance between first and second nodes of an electrical circuit without removing components from the circuit, the method comprising the steps of:
   a) selecting first and second nodes within the circuit;
   b) selecting a common node at a location different from the first and second nodes and that has a concurrent current flow equal in value to current flow between the first and second nodes;
   c) applying first and second currents of known values at the respective first and second nodes;
   d) measuring at least four voltages, including:
      i) a voltage between the first and common nodes measured at the first node caused by the first current;
      ii) a voltage between the first and common nodes measured at the first node caused by the second current;
      iii) a voltage between the second and common nodes measured at the second node caused by the first current; and
      iv) a voltage between the second and common nodes measured at the second node caused by the second current; and e) calculating the impedance based on known values of currents and measured values voltages.

30. A method in accordance with claim 29, wherein the step of calculating the impedance further includes:
   a) treating the first and second nodes as a cross member of a pi network; and
   b) treating remaining circuitry of both the electrical circuit and measurement device as side shunts of the pi network containing the parallel effects of all components in the electrical circuit and measurement device.

31. A method in accordance with claim 29, further comprising the step of using a trace or via as a shunt element to separate parallel components.

32. A method in accordance with claim 29, wherein the step of applying first and second currents includes:
   contacting the first and second nodes with at least respective first and second probes; and
   contacting the common node with at least a third common probe.

33. A method in accordance with claim 32, wherein the step of measuring the voltages includes:
   contacting the first and second nodes with at least respective fourth and fifth probes; and
   contacting the common node with at least a sixth common probe.

34. A method in accordance with claim 29, wherein the step of applying first and second currents further includes applying different first and second current signals.

35. A method in accordance with claim 29, wherein the step of applying first and second currents further includes applying different sinusoidal current signals.

36. A method in accordance with claim 29, further comprising the step of:
   separating the voltages corresponding to the first and second currents at the first and second nodes.

37. A method in accordance with claim 29, further comprising the steps of:
   a) activating the circuit and analyzing system signals present in the circuit prior to applying the currents;
   b) selecting frequencies for the currents which will not conflict with the system signals or which will have predictable conflicts with the system signals prior to applying the currents; and
   c) separating the voltages caused by the currents.

38. A method in accordance with claim 29, further comprising the step of:
   calibrating by switching the current sources and voltage meters to a reference resistor.

39. A method in accordance with claim 29, further comprising the step of:
   verifying proper contact by determining the current.

40. A method in accordance with claim 29, further comprising the step of:
   providing an internal shunt by unbalancing a plurality of resistors forming the current sources.

41. A method in accordance with claim 29, wherein the step of calculating the impedance further includes:
   calculating the impedance utilizing the formula $$Z_2 = ((V_{11} * V_{00}/V_{01}) - V_{10})/I_0$$

where
   $Z_2$ is the impedance of the component;
   $V_{00}$ is the voltage between the first and common nodes measured at the first node caused by the first current;
   $V_{01}$ is the voltage between the first and common nodes measured at the first node caused by the second current;
   $V_{10}$ is the voltage between the second and common nodes measured at the second node caused by the first current;
   $V_{11}$ is the voltage between the second and common nodes measured at the second node caused by the second current; and
   $I_0$ is the first current.

42. A method in accordance with claim 29, wherein the step of calculating the impedance further includes:
   calculating the impedance utilizing the formula $$Z_2 = ((V_{11} * V_{00}/V_{10}) - V_{01})/I_1$$

where
   $Z_2$ is the impedance of the component;
   $V_{00}$ is the voltage between the first and common nodes measured at the first node caused by the first current;
   $V_{01}$ is the voltage between the first and common nodes measured at the first node caused by the second current;
   $V_{10}$ is the voltage between the second and common nodes measured at the second node caused by the first current;
   $V_{11}$ is the voltage between the second and common nodes measured at the second node caused by the second current; and
   $I_1$ is the second current.

43. A method for measuring an impedance between first and second nodes in an electrical circuit, the method comprising the steps of:
   a) contacting the first and second nodes with first and second probes;
   b) selecting a common node at a location which experiences an equal current flow with respect to the first and second nodes;
   c) contacting the common node with a third probe;
   d) applying a first current of known value at the first node;
   e) applying a second current of known value at the second node;
   f) measuring a first voltage at the first node due to the first current;
   g) measuring a second voltage at the first node due to the second current source;
   h) measuring a third voltage at the second node due to the second current source;
   i) measuring a fourth voltage at the second node due to the first current source; and
   j) calculating the impedance of the component based on the known values of the first and second currents and the measured values of the first, second, third and fourth voltages.

44. A method in accordance with claim 43, wherein the step of calculating the impedance further includes:
   a) treating the first and second nodes as a cross member of a pi network; and
   b) treating remaining circuitry of both the electrical circuit and measurement device as side shunts of the pi network containing the parallel effects of all components in the circuit and the loading of the measurement device.

45. A method in accordance with claim 43, further comprising the step of using a trace or via as a shunt element to separate parallel components.

46. A method in accordance with claim 43, wherein the step of measuring the voltages includes:

contacting the first and second nodes with at least respective fourth and fifth probes; and contacting the common node with at least a sixth common probe.

47. A method in accordance with claim 43, wherein the step of calculating the impedance further includes:

calculating the impedance utilizing the formula $$Z_2 = ((V_{11} * V_{00}/V_{01}) - V_{10})/I_0$$

where $Z_2$ is the impedance of the component;

$V_{00}$ is the voltage measured at the first node caused by the first current;

$V_{01}$ is the voltage measured at the first node caused by the second current;

$V_{10}$ is the voltage measured at the second node caused by the first current;

$V_{11}$ is the voltage measured at the second node caused by the second current; and $I_0$ is the first current.

48. A method in accordance with claim 43, wherein the step of calculating the impedance further includes:

calculating the impedance utilizing the formula $$Z_2 = ((V_{11} * V_{00}/V_{10}) - V_{01})/I_1$$

where $Z_2$ is the impedance of the component;

$V_{00}$ is the voltage measured at the first node caused by the first current;

$V_{01}$ is the voltage measured at the first node caused by the second current;

$V_{10}$ is the voltage measured at the second node caused by the first current;

$V_{11}$ is the voltage measured at the second node caused by the second current; and $I_1$ is the second current.

49. A method in accordance with claim 43, wherein the steps of applying first and second currents further includes applying different first and second current signals.

50. A method in accordance with claim 43, wherein the steps of applying first and second currents further includes applying different sinusoidal current signals.

51. A method in accordance with claim 43, further comprising the step of:

separating the voltages corresponding to the first and second currents at the first and second nodes.

52. A method in accordance with claim 43, further comprising the steps of:

a) activating the circuit and analyzing system signals present in the circuit prior to applying the currents;

b) selecting frequencies for the currents which will not conflict with the system signals or which will have predictable conflicts with the system signals prior to applying the currents; and c) separating the voltages caused by the currents.

53. A method in accordance with claim 43, further comprising the step of:

calibrating by switching the current sources and voltage meters to a reference resistor.

54. A method in accordance with claim 43, further comprising the step of:

verifying proper contact by determining the current.

55. A method in accordance with claim 43, further comprising the step of:

providing an internal shunt by unbalancing a plurality of resistors forming the current sources.

56. A device configured to measure an impedance between first and second nodes in an electrical circuit, the device comprising:

a) a voltage source configured to provide a voltage of known value;

b) a current source configured to provide a current of known value;

c) first and second probes, each connected to one of the voltage and current sources, and configured to contact the respective first and second nodes to apply the voltage and current to the first and second nodes;

d) a third common probe, connected to the voltage and current sources, configured to contact the circuit at a common node at a location that has an equal current flow with respect to the first and second nodes;

e) at least one voltage meter, configured to be connected to the first and second nodes, to measure voltages corresponding to the known voltage and current; and f) a processor, operatively coupled to the voltage and current sources and the at least one voltage meter, capable of calculating the impedance based on the known values of the voltage and current and the measured values of the voltages.

57. A method for measuring an impedance between first and second nodes in an electrical circuit, the method comprising the steps of:

a) contacting the first and second nodes with first and second probes;

b) selecting a common node at a location which experiences an equal current flow with respect to the first and second nodes;

c) contacting the common node with a third probe;

d) applying a known current at the first node;

e) applying a known voltage at the second node;

f) measuring at least three voltages, including:

i) a voltage between the first and common nodes measured at the first node caused by the known current;

ii) a voltage between the first and common nodes measured at the first node caused by the known voltage; and iii) a voltage between the second and common nodes measured at the second node caused by the known current; and g) calculating the impedance based on the known current and voltage and the measured values of the at least three voltages.

* * * * *